United States Patent [19]
Choi

[11] Patent Number: 5,933,388
[45] Date of Patent: Aug. 3, 1999

[54] SUB ROW DECODER CIRCUIT FOR SEMICONDUCTOR MEMORY DEVICE

[75] Inventor: Byoung Jin Choi, Ichon-shi, Rep. of Korea

[73] Assignee: Hyundai Electronics Industries Co., Ltd., Kyoungki-do, Rep. of Korea

[21] Appl. No.: 08/998,889

[22] Filed: Dec. 29, 1997

[30] Foreign Application Priority Data

Dec. 31, 1996 [KR] Rep. of Korea ...................... 96-80247
Dec. 31, 1996 [KR] Rep. of Korea ...................... 96-80248

[51] Int. Cl.⁶ ...................................................... G11C 8/00
[52] U.S. Cl. ................................ 365/230.06; 365/189.06; 365/189.07; 365/189.11
[58] Field of Search ......................... 365/230.06, 189.06, 365/189.07, 189.11

[56] References Cited

U.S. PATENT DOCUMENTS

| | | | |
|---|---|---|---|
| 5,506,816 | 4/1996 | Hirose et al. | 365/230.06 |
| 5,717,650 | 2/1998 | Chung et al. | 365/230.06 |
| 5,808,955 | 9/1998 | Hwang et al. | 365/230.06 |
| 5,818,790 | 10/1998 | Kim et al. | 365/230.06 |

*Primary Examiner*—David Nelms
*Assistant Examiner*—Hien Nguyen
*Attorney, Agent, or Firm*—Thelen Reid & Priest LLP

[57] ABSTRACT

A sub row decoder circuit for a semiconductor memory device, comprising a bootstrap transistor connected between a pull-up signal input node and a bootstrap node, a pull-up transistor connected between a word line boosting signal line and a word line, a switching transistor connected between the pull-up signal input node and a first node, and a pull-down transistor connected in the form of a diode between the first node and the word line. The bootstrap transistor has its gate for inputting a voltage signal, and the pull-up transistor has its gate connected to the bootstrap node. The switching transistor has its gate for inputting an inverted one of a pull-up signal at the pull-up signal input node. According to the present invention, a source of the pull-down transistor is connected not to a ground voltage but to the pull-up signal, thereby making layout and processing ready. Further, the pull-up signal and a pull-down signal have the same voltage level in a standby mode, thereby preventing a standby current from being increased although metal lines are short-circuited.

6 Claims, 3 Drawing Sheets

SUB ROW DECODER CIRCUIT FOR SEMICONDUCTOR MEMORY DEVICE

BACKGROUND OF THE INVENTION

1. Field of the Invention

The present invention relates in general to a sub row decoder circuit for a semiconductor memory device comprising a pull-up transistor for transferring a word line boosting signal to a word line, and a pull-down transistor for transferring a ground voltage to the word line, and more particularly to a sub row decoder circuit in which a source of the pull-down transistor is connected not to the ground voltage but to a pull-up signal, thereby making layout and processing ready, and the pull-up signal and a pull-down signal have the same voltage level in a standby mode, thereby preventing a standby current from being increased although metal lines are short-circuited.

2. Description of the Prior Art

Generally, a row decoder is used in a semiconductor memory device to control word lines. Because of a small space resulting from a high integration of the memory device, it is difficult to lay out one decoder to one word line. For this reason, in most semiconductor memory devices, there has recently been used a hierarchical word line structure where a plurality of hierarchical word line drive circuits share one output of the row decoder and are distinguished from one another by sub row decoders (pxi generators).

The hierarchical word line structure is generally used to loosen a strict metal design rule in the metal strapping of a word line. The metal strapping is to arrange a metal line on a cell array according to a word line pitch and connect it to a word line of polysilicon to reduce a resistance of the word line, thereby increasing a drive speed. Here, the "pitch" signifies the sum of width and space between regularly arranged lines. Because a word line pitch is reduced according to an increase in the integration degree of a semiconductor memory device, the metal strapping increases the possibility of a failure in metal processing, resulting in a reduction in yield. For this reason, the hierarchical word line structure has essentially been applied to semiconductor memory devices, beginning with a 64 Mb dynamic random access memory (DRAM).

The present invention is applicable to all memory devices employing sub row decoder circuits which drive low-order word lines in the hierarchical word line structure.

A conventional low-order word line drive circuit employed in the hierarchical word line structure is generally composed of three NMOS transistors. The low-order word line drive circuit is adapted to perform a double bootstrapping operation to drive a low-order word line at a boosted high voltage level Vpp.

FIG. 1 is a detailed circuit diagram of a conventional sub row decoder circuit for driving a word line WLi. As shown in this drawing, the sub row decoder circuit comprises a first NMOS transistor MN1 connected between an input signal line N1 (first node) and a second node N2, a second NMOS transistor MN2 connected between a word line boosting signal (px+0) line and a word line SWL0, and a third NMOS transistor MN3 connected between the word line SWL0 and a ground voltage Vss. The first NMOS transistor MN1 has its gate for inputting a voltage signal Vx, and the second NMOS transistor MN2 has its gate connected to the second node N2. The third NMOS transistor MN3 has its gate for inputting an inverted one of an input signal on the input signal line N1.

The second NMOS transistor MN2 acts as a pull-up transistor for pulling up the word line SWL0 to a high voltage level Vpp, and the third NMOS transistor MN3 acts as a pull-down transistor for pulling down the word line SWL0 to the ground voltage level Vss (0 V). The first NMOS transistor MN1 acts as a bootstrap transistor for precharging the second node N2. The first NMOS transistor MN1 also acts as a switch for maintaining a voltage at the second node N2 as it is after being bootstrapped. In most cases, Vx=Vcc (logic high) and the second node N2 is precharged with a voltage of Vx−Vt (Vt is a threshold voltage). After the lapse of a predetermined time period from the precharging of the second node N2, the word line boosting signal px+0 is made active to the high voltage level Vpp, thereby causing the second node N2 to be bootstrapped to a voltage of Vpp+Vt or more. As a result, the high voltage Vpp of the word line boosting signal px+0 is directly transferred to the word line SWL0 through the pull-up transistor MN1.

However, the above-mentioned conventional sub row decoder circuit has a disadvantage in that a source of the pull-down transistor is connected to the ground voltage Vss, resulting in a separate ground voltage power line being required.

On the other hand, in a DRAM, polysilicon is generally used as a gate of a cell transistor. However, because the polysilicon is large in resistance, the signal transfer from a row decoder to cells being far away therefrom becomes slow. A metal strapping technique has been proposed to overcome such a problem. However, the metal strapping technique has a difficulty in processing because of a narrower space between metal lines resulting from a higher integration degree. On the other hand, a sub row decoder technique has been proposed to reduce the number of metal lines to half or less to make the processing ready. The sub row decoder technique can conventionally be classified into a CMOS method and an NMOS method. In the CMOS method, the number of metal lines is reduced to ¼ to make the metal processing ready. Further, since the metal lines have the same voltage level in a standby mode, a standby current is not increased although the metal lines are short-circuited. However, a separate N-well is required because of the use of PMOS, resulting in an increase in occupied area. In the NMOS method, no separate well is required, resulting in a reduction in occupied area. However, since the metal lines have different voltage levels in the standby mode, the standby current is increased if the metal lines are short-circuited. The increase of the standby current makes the memory device useless even if it is repaired.

SUMMARY OF THE INVENTION

Therefore, the present invention has been made in view of the above problems, and it is an object of the present invention to provide a sub row decoder circuit for a semiconductor memory device in which a source of a pull-down transistor for disabling a word line is connected not to a ground voltage but to a pull-up signal, thereby removing a ground voltage power line.

It is another object of the present invention to provide a sub row decoder circuit for a semiconductor memory device in which a source of a pull-down transistor for disabling a word line is connected not to a ground voltage but to a pull-up signal, so that the pull-up signal and a pull-down signal can have the same voltage level in a standby mode, thereby preventing a standby current from being increased although metal lines are short-circuited.

In accordance with one aspect of the present invention, there is provided a sub row decoder circuit for a semiconductor memory device, comprising a bootstrap transistor connected between a pull-up signal input node and a bootstrap node, the bootstrap transistor having its gate for inputting a voltage signal; a pull-up transistor connected between a word line boosting signal line and a sub word line, the pull-up transistor having its gate connected to the bootstrap node; and a pull-down transistor connected between the sub word line and the pull-up signal input node, the pull-down transistor having its gate for inputting an inverted one of a pull-up signal at the pull-up signal input node.

In accordance with another aspect of the present invention, there is provided a sub row decoder circuit for a semiconductor memory device, comprising a bootstrap transistor connected between a pull-up signal input node and a bootstrap node, the bootstrap transistor having its gate for inputting a voltage signal; a pull-up transistor connected between a word line boosting signal line and a word line, the pull-up transistor having its gate connected to the bootstrap node; a switching transistor connected between the pull-up signal input node and a first node, the switching transistor having its gate for inputting an inverted one of a pull-up signal at the pull-up signal input node; and a pull-down transistor connected in the form of a diode between the first node and the word line.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
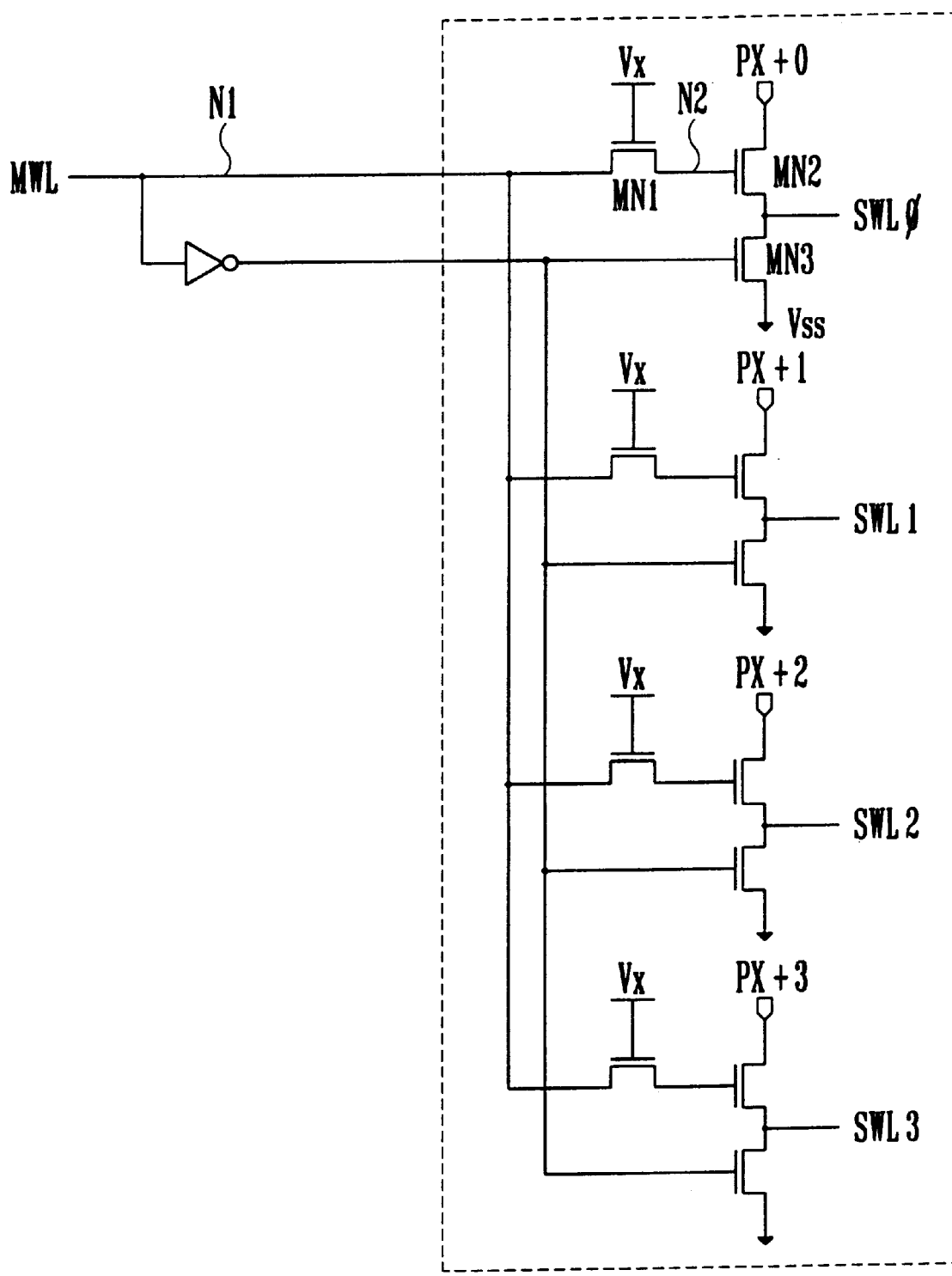
FIG. 1 is a detailed circuit diagram of a conventional sub row decoder circuit employing NMOS transistors.
Figure 2:
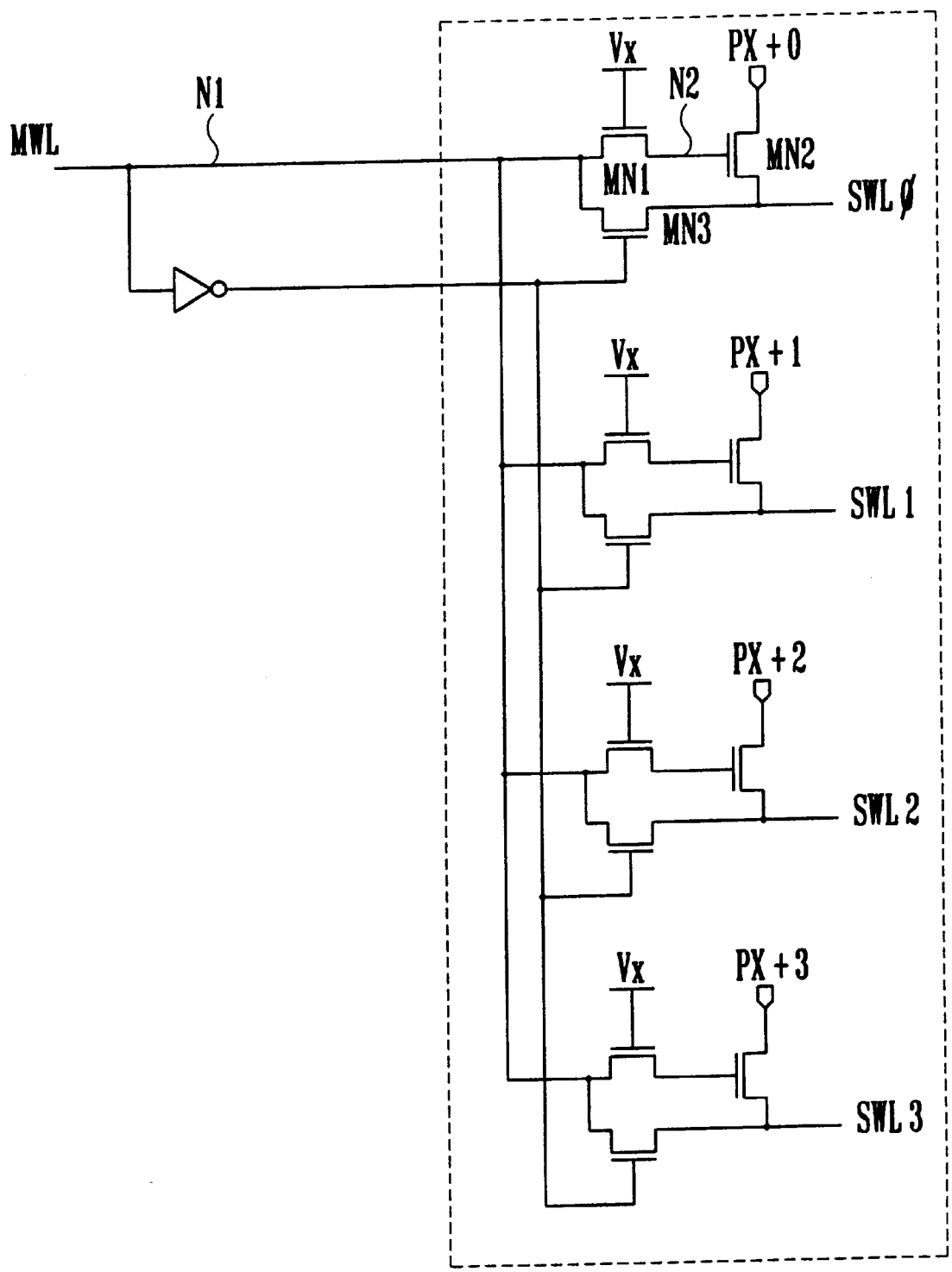
FIG. 2 is a detailed circuit diagram of a sub row decoder circuit in accordance with an embodiment of the present invention.

FIG. 2 is a detailed circuit diagram of a sub row decoder circuit in accordance with an embodiment of the present invention. As shown in this drawing, the sub row decoder circuit comprises a bootstrap transistor MN1 connected between a pull-up signal input node N1 and a bootstrap node N2, a pull-up transistor MN2 connected between a word line boosting signal (px+0) line and a sub word line SWL0, and a pull-down transistor MN3 connected between the sub word line SWL0 and the pull-up signal input node N1. The bootstrap transistor MN1 has its gate for inputting a voltage signal Vx. The pull-up transistor MN2 has its gate connected to the bootstrap node N2, and the pull-down transistor MN3 has its gate for inputting an inverted one of a pull-up signal at the pull-up signal input node N1.

The operation of the sub row decoder circuit with the above-mentioned construction in accordance with the embodiment of the present invention will hereinafter be described in detail.

First, in the case where a main row decoder (not shown) is selected by an input address signal, the pull-up signal input node N1 which is an output node of the main row decoder becomes a supply voltage level Vcc. If a gate voltage of the bootstrap transistor MN1 has the supply voltage level Vcc, a voltage of Vcc−Vtn (Vtn is a threshold voltage of the bootstrap transistor MN1) is transferred to the bootstrap node N2.

Then, if a high voltage transfer decoder (not shown) selects any one (for example, px+0) of the word line boosting signal (px+i) lines (high voltage transfer nodes) to transfer a word line enabling high voltage Vpp thereto, the word line boosting signal at the high voltage transfer node px+0 goes from a ground voltage level Vss to the high voltage level Vpp. As a result, the voltage of Vcc−Vtn at the gate node N2 of the pull-up transistor MN2, maintained due to a capacitance between the high voltage transfer node px+0 and the node N2, is raised to the high voltage level Vpp or more, thereby causing the high voltage Vpp at the high voltage transfer node px+0 to be transferred to the word line SWL0.

On the other hand, in the case where the main row decoder is not selected, the bootstrap node N2 becomes the ground voltage level Vss. As a result, the capacitance of the pull-up transistor MN2 becomes small, resulting in no bootstrapping. In the case where the high voltage transfer node px+0 has the ground voltage level Vss although the main row decoder is selected, the pull-up transistor MN2 is turned off, thereby causing the word line not to be enabled. Also, in the case where the main row decoder is not selected, the first node N1 becomes low in logic to turn off the pull-up transistor MN2. In this case, the pull-down transistor MN3 is turned on by an inverted one of the pull-up signal at the first node N1 to transfer the ground voltage Vss at the first node N1 to the sub word line SWL0.

Figure 3:
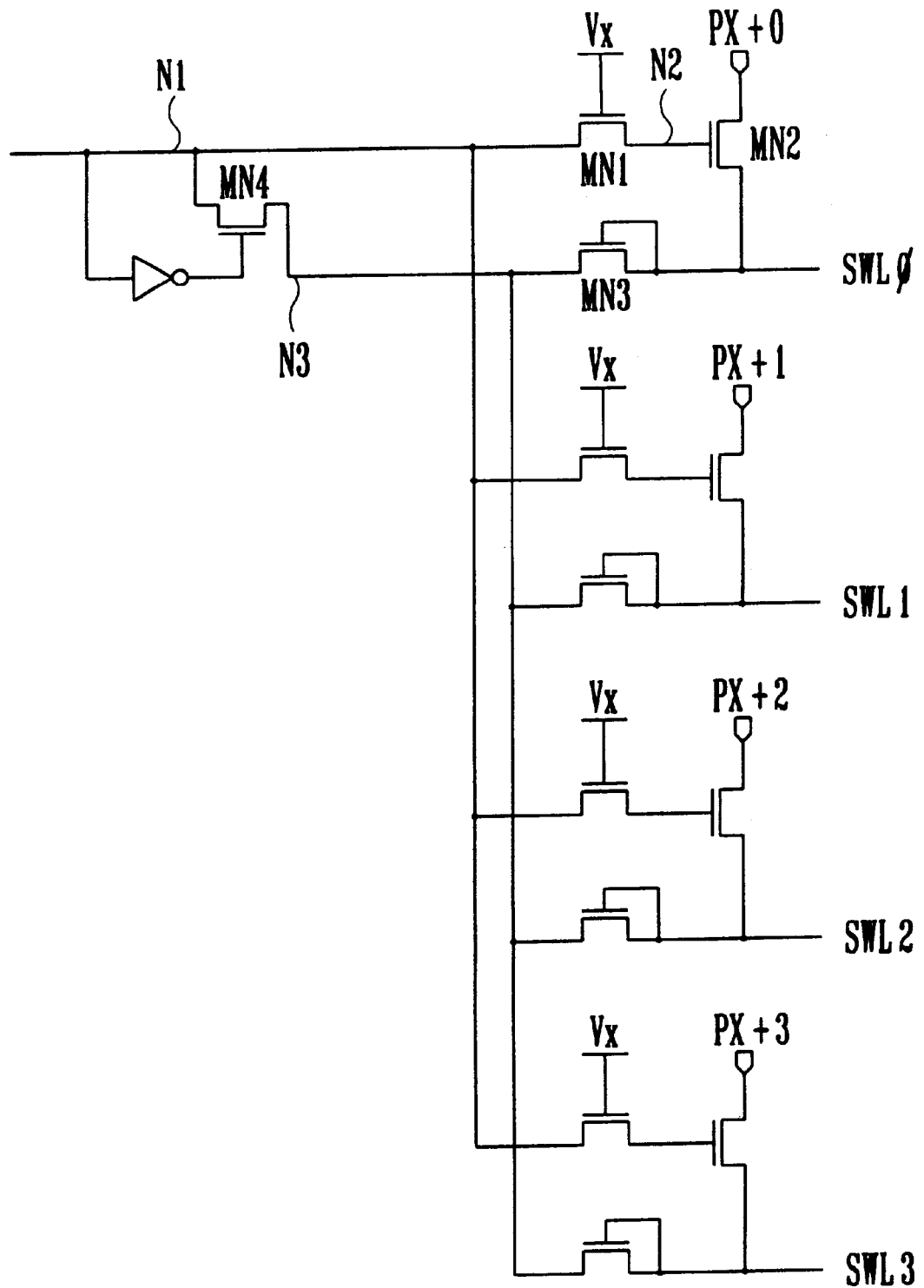
FIG. 3 is a detailed circuit diagram of a sub row decoder circuit in accordance with an alternative embodiment of the present invention.

FIG. 3 is a detailed circuit diagram of a sub row decoder circuit in accordance with an alternative embodiment of the present invention. In the second embodiment of the present invention, a source of a pull-down transistor for disabling a word line is connected not to a ground voltage but to a pull-up signal, so that the pull-up signal and a pull-down signal can have the same voltage level in a standby mode, thereby preventing a standby current from being increased although metal lines are short-circuited.

As shown in FIG. 3, the sub row decoder circuit comprises a bootstrap transistor MN1 connected between a pull-up signal input node N1 and a bootstrap node N2, a pull-up transistor MN2 connected between a word line boosting signal (px+0) line and a word line SWL0, a fourth NMOS transistor MN4 connected between the pull-up signal input node N1 and a third node N3, and a pull-down transistor MN3 connected in the form of a diode between the third node MN3 and the word line SWL0.

The bootstrap transistor MN1 has its gate for inputting a voltage signal Vx. The pull-up transistor MN2 has its gate connected to the bootstrap node N2, and the fourth NMOS transistor MN4 has its gate for inputting an inverted one of a pull-up signal at the pull-up signal input node N1.

The operation of the sub row decoder circuit with the above-mentioned construction in accordance with the second embodiment of the present invention will hereinafter be described in detail.

Similarly to the first embodiment of FIG. 2, in the case where a main row decoder is selected by an input address signal, the pull-up signal input node N1 which is an output node of the main row decoder becomes a supply voltage level Vcc. If a gate voltage of the bootstrap transistor MN1 has the supply voltage level Vcc, a voltage of Vcc−Vtn (Vtn is a threshold voltage of the bootstrap transistor MN1) is transferred to the bootstrap node N2.

Then, if a high voltage transfer decoder selects any one (for example, px+0) of the word line boosting signal (px+i) lines (high voltage transfer nodes) to transfer a word line enabling high voltage Vpp thereto, the word line boosting signal at the high voltage transfer node px+0 goes from a ground voltage level Vss to the high voltage level Vpp. As a result, the voltage of Vcc–Vtn at the gate node N2 of the pull-up transistor MN2, maintained due to a capacitance between the high voltage transfer node px+0 and the node N2, is raised to the high voltage level Vpp or more, thereby causing the high voltage Vpp at the high voltage transfer node px+0 to be transferred to the word line SWL0.

By the way, in the case where the main row decoder is not selected, the bootstrap node N2 becomes the ground voltage level Vss. As a result, the capacitance of the pull-up transistor MN2 becomes small, resulting in no bootstrapping. In the case where the high voltage transfer node px+0 has the ground voltage level Vss although the main row decoder is selected, the pull-up transistor MN2 is turned off, thereby causing the word line not to be enabled. Also, in the case where the main row decoder is not selected, the pull-up signal input node N1 becomes low in logic to turn off the pull-up transistor MN2. In this case, the fourth NMOS transistor MN4 is turned on by an inverted one of the pull-up signal at the pull-up signal input node N1 to allow the pull-up signal at the pull-up signal input node N1 and a pull-down signal at the third node N3 to have the same voltage level. On the other hand, if the pull-up signal at the pull-up signal input node N1 is high in logic, the fourth NMOS transistor MN4 is turned off to separate the pull-up signal at the pull-up signal input node N1 from the pull-down signal at the third node N3. Noticeably, the pull-up signal has a substrate voltage level Vbb or a voltage level lower than a threshold voltage level –Vtn, to maintain the word line at a sufficiently low voltage level. Further, an NMOS diode is used as the pull-down transistor MN3. The reason is that, when one word line is selected to have a high voltage level, pull-down transistors connected to the other three word lines are turned off to allow the other word lines to become low in logic.

The above-mentioned pull-up signal is outputted from the main row decoder to control the pull-up and pull-down transistors for driving the word line.

As apparent from the above description, according to the present invention, the source of the pull-down transistor is connected to the pull-up signal as compared with the conventional one connected to the ground voltage. Therefore, the ground voltage power line can be removed in the sub row decoder area, thereby making the layout and processing ready. Further, the pull-up signal and the pull-down signal have the same voltage level in the standby mode, thereby preventing the standby current from being increased although the metal lines are short-circuited. Therefore, the memory device can normally be operated even after it is repaired, resulting in an increase in yield. Moreover, because the sub row decoder circuit is driven by only NMOS, it requires no separate well, resulting in little increase in occupied area.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A sub row decoder circuit for a semiconductor memory device, the circuit comprising:

a bootstrap transistor connected between a first signal input node and a bootstrap node, said bootstrap transistor having a bootstrap transistor gate for inputting a voltage signal;

a pull-up transistor connected between a word line boosting signal line and a sub word line, said pull-up transistor having a pull-up transistor gate connected to said bootstrap node; and a pull-down transistor, connected between said sub word line and said first signal input node, for transferring a first signal from the first signal input node to said word line, said pull-down transistor having a pull-down transistor gate for inputting an inverted first signal.

2. A sub row decoder circuit for a semiconductor memory device, as set forth in claim 1, wherein said bootstrap transistor, pull-up transistor and pull-down transistor are NMOS transistors.

3. A sub row decoder circuit for a semiconductor memory device, comprising:

a bootstrap transistor connected between a pull-up signal input node and a bootstrap node, said bootstrap transistor having its gate for inputting a voltage signal;

a pull-up transistor connected between a word line boosting signal line and a word line, said pull-up transistor having its gate connected to said bootstrap node;

a switching transistor connected between said pull-up signal input node and a first node, said switching transistor having its gate for inputting an inverted one of a pull-up signal at said pull-up signal input node; and a pull-down transistor connected in the form of a diode between said first node and said word line.

4. A sub row decoder circuit for a semiconductor memory device, as set forth in claim 3, wherein said bootstrap transistor, switching transistor, pull-up transistor and pull-down transistor are NMOS transistors.

5. A sub row decoder circuit for a semiconductor memory device, as set forth in claim 3, wherein said pull-up signal has a substrate voltage level when it is low in logic.

6. A sub row decoder circuit for a semiconductor memory device, as set forth in claim 3, wherein said pull-up signal has a voltage level lower than a threshold voltage when it is low in logic.

* * * * *